United States Patent [19]
Eguchi

[11] Patent Number: 6,093,575
[45] Date of Patent: Jul. 25, 2000

[54] SEMICONDUCTOR DEVICE AND PRODUCTION METHOD OF A SEMICONDUCTOR DEVICE HAVING A CAPACITOR

[75] Inventor: Kohei Eguchi, Tokyo, Japan

[73] Assignee: Nippon Steel Corporation, Tokyo, Japan

[21] Appl. No.: 09/057,371

[22] Filed: Apr. 9, 1998

Related U.S. Application Data

[62] Division of application No. 08/707,713, Sep. 4, 1996, abandoned.

[51] Int. Cl.⁷ ............................ H01L 21/8242; H01G 7/06
[52] U.S. Cl. .................................................. 438/3; 438/240
[58] Field of Search ................................ 438/3, 238–240, 438/250–256, 381, 393–399

[56] References Cited

U.S. PATENT DOCUMENTS

| | | | |
|---|---|---|---|
| 4,944,836 | 7/1990 | Beyer et al. ........................... | 156/645 |
| 5,046,043 | 9/1991 | Miller et al. ........................... | 257/295 |
| 5,330,931 | 7/1994 | Emesh et al. . | |
| 5,369,296 | 11/1994 | Kato ........................................ | 257/295 |
| 5,416,042 | 5/1995 | Beach et al. . | |
| 5,506,166 | 4/1996 | Sandhu et al. . | |
| 5,844,771 | 12/1998 | Graettinger et al. . | |
| 5,907,762 | 5/1999 | Evans et al. ............................... | 438/3 |

FOREIGN PATENT DOCUMENTS

| | | |
|---|---|---|
| 2-116195 | 7/1990 | Japan . |
| 3-103085 | 4/1991 | Japan . |
| 5-343617 | 11/1993 | Japan . |
| 6-236962 | 10/1994 | Japan . |
| 6-132482 | 12/1994 | Japan . |
| 7-169854 | 5/1995 | Japan . |

*Primary Examiner*—Jey Tsai
*Attorney, Agent, or Firm*—Pollock, Vande Sande & Amernick

[57] ABSTRACT

When a capacitor is formed on a semiconductor substrate, a lower electrode of the capacitor is first formed. After an insulating film is formed on the lower electrode, it is selectively etched until the lower electrode is exposed, and in this way, a hole portion is formed in the insulating film. After a ferroelectric film is formed inside the hole portion and on the insulating film, the ferroelectric film is polished and removed by a chemical-mechanical polishing method in such a manner as to leave the ferroelectric film inside the hole portion. Thereafter, an upper electrode of the capacitor is formed on the ferroelectric film.

15 Claims, 4 Drawing Sheets

SEMICONDUCTOR DEVICE AND PRODUCTION METHOD OF A SEMICONDUCTOR DEVICE HAVING A CAPACITOR

This application is a divisional application of U.S. patent application Ser. No. 08/707,713, filed Sep. 4, 1996, now abandoned.

BACKGROUND OF THE INVENTION

1. Field of the Invention

The present invention relates to a semiconductor device and a production method thereof. More particularly, the present invention relates to a semiconductor device having a capacitance element (capacitor) using a ferroelectric film as a dielectric film and a production method thereof.

2. Description of the Related Art

Attempts have been made to form a capacitance element by using a ferroelectric film as a dielectric film in order to achieve higher operation speed and a higher integration density of a DRAM (Dynamic Random Access Memory). The following methods are known for forming such a capacitance element on a semiconductor substrate.

(1) A lower electrode and an insulating body are serially formed on a semiconductor substrate. After a hole is formed in the insulating body, a paste-like ferroelectric body is buried into the insulating body in such a manner that one of the ends thereof comes into contact with the lower electrode. Thereafter, an upper electrode is formed on the insulating body in such a manner as to come into contact with the other end of the ferroelectric body (refer to JP-A-2-116195).

(2) An inter-level insulating film and a diffusion barrier layer are serially formed on a semiconductor substrate. A well-like ditch is defined in the diffusion barrier layer, and a lower electrode is buried into this ditch. The diffusion barrier layer and the lower electrode are then etched or polished until the diffusion barrier layer and the lower electrode are flattened. A ferroelectric thin film is formed on the diffusion barrier layer and the lower electrode so flattened. Thereafter, an upper electrode is formed on the ferroelectric thin film (refer to JP-A-7-169854).

When a ferroelectric substance made of a dielectric material such as $SrTiO_3$, $BaTiO_3$ or $(Ba, Sr)TiO_3$ (titanate film containing Ba and Sr) is used in order to reduce the area of the capacitance element without lowering its capacitance value, however, it is extremely difficult to apply dry etching to such a ferroelectric substance because it is impossible to form a plasma gas forming a volatile reaction product which vaporizes Ba or Sr. As a result, it is extremely difficult according to the method (1) to conduct fine machining so as to bury the ferroelectric substance made of the dielectric material such as $SrTiO_3$, $BaTiO_3$ or $(Ba, Sr)TiO_3$ into the insulating body. Though the ferroelectric substance made of the dielectric material such as $SrTiO_3$, $BaTiO_3$ or $(Ba, Sr)TiO_3$ can be wet etched, fine etching is difficult because wet etching is anisotropic etching.

The method (2) uses a perovskite type oxide ferroelectric thin film such as a PZT thin film as the ferroelectric thin film and $SiO_2$ as the inter-level insulating film. Therefore, a diffusion barrier layer is necessary to prevent mutual diffusion of Pb and Si between the ferroelectric thin film and the inter-level insulating film, so that fine etching is difficult to practice.

As another method of burying the ferroelectric substance made of a dielectric material such as $BaTiO_3$ into the ditch of the substrate, JP-A-3-103085 discloses a method of manufacturing a dielectric moving member in a power generator utilizing electrostatic force in the technical field different from that of a production method of semiconductor devices. According to this method, a ferroelectric film such as $BaTiO_3$ is formed on a substrate having ditches in such a manner so as to bury the ditches, and the surface of the ferroelectric film is polished by lapping, polishing, etching, etc, to leave the ferroelectric film only inside the ditches. However, this reference does not mention the use of a chemical-mechanical polishing method as the polishing method of the ferroelectric substance made of a dielectric material such as $BaTiO_3$.

An example of the use of the chemical-mechanical polishing method in production methods of semiconductor devices is described in U.S. Pat. No. 4,944,836. According to this reference, an insulating layer having ditches is formed on a semiconductor substrate, a metallic layer is then formed in such a manner as to bury the ditches, and the surfaces of the metallic layer and the insulating layer are then polished by the chemical-mechanical polishing method to leave the metallic layer only inside the ditches of the insulating layer. However, as transistor devices, are also formed on the semiconductor substrate in semiconductor memory devices underlying-steps are produced under the ferroelectric film. Therefore, the underlying steps exist when the ferroelectric film is polished by the chemical-mechanical polishing method, the ferroelectric film cannot be correctly buried into the ditches. However, JP-A-3-103085 and U.S. Pat. No. 4,944,836 do not teach how to solve this problem.

SUMMARY OF THE INVENTION

It is an object of the preset invention to provide a semiconductor device which has a capacitance element using a ferroelectric substrate made of a dielectric such as $SrTiO_3$, $BaTiO_3$ or $(Ba, Sr)TiO_3$ as a dielectric, and which is finely machined.

It is another object of the present invention to provide a method of manufacture a semiconductor device which has a capacitance element using a ferroelectric substance made of a dielectric such as $SrTiO_3$, $BaTiO_3$ or $(Ba, Sr)TiO_3$ as a dielectric and which can be machined finely.

SUMMARY OF THE INVENTION

The first production method of a semiconductor device according to the present invention is a production method of a semiconductor device having a capacitor formed on a semiconductor substrate, which comprises the steps of:

a) forming a lower electrode of the capacitor;

b) forming an insulating film on the lower electrode;

c) forming a hole portion in the insulating film by selectively etching the insulating film until the lower electrode is exposed;

d) forming a ferroelectric film inside the hole portion and on the insulating film;

e) polishing and removing the ferroelectric substance by a chemical-mechanical polishing method in such a manner as to leave the ferroelectric film inside the hole portion; and f) forming an upper electrode of the capacitor on the ferroelectric film.

The second production method of a semiconductor device according to the present invention is a production method of a semiconductor device having a capacitor formed on a semiconductor substrate, which comprises the steps of:

a) forming an inter-level insulating film on the semiconductor substrate;

b) polishing the surface of the inter-level insulating film so as to flatten the surface;

c) forming a lower electrode of the capacitor on the inter-level insulating film whose surface is flattened;

d) forming an insulating film on the lower electrode;

e) forming a hole portion in the insulating film by selectively etching the insulating film until the lower electrode is exposed;

f) forming a ferroelectric film inside the hole portion and on the insulating film;

g) polishing and removing the ferroelectric film by a chemical-mechanical polishing method in such a manner as to leave the ferroelectric film inside the hole portion; and h) forming an upper electrode of the capacitor on the ferroelectric film.

The third production method of a semiconductor device according to the resent invention is a production method of a semiconductor device having a capacitor formed on a semiconductor substrate, which comprises:

a first step of forming an inter-level insulating film on the semiconductor substrate;

a second step of forming a contact hole in the inter-level insulating film;

a third step of forming a lower electrode of the capacitor on the inter-level insulation film inside the contact hole and around the contact;

a fourth step of forming a first insulating film on the lower electrode and on the inter-level insulating film;

a fifth step of polishing and removing the first insulating film by a chemical-mechanical polishing method until the lower electrode is exposed;

a sixth step of forming a second insulating film on the first insulating film and on the exposed lower electrode;

a seventh step of forming a hole portion reaching the surface of the exposed lower electrode in the second insulating film by selectively etching the second insulating film until the surface of the exposed lower electrode is exposed;

an eighth step of forming a ferroelectric film inside the hole portion and on the second insulating film;

a ninth step of polishing and removing the ferroelectric film by a chemical-mechanical polishing method in such a manner as to leave the ferroelectric film inside the hole portion; and a tenth step of forming an upper electrode of the capacitor on the ferroelectric film.

The first semiconductor device according to the present invention is a semiconductor device having a capacitor formed on a semiconductor substrate, which comprises:

an inter-level insulating film formed on the semiconductor substrate and having a surface which is flattened;

a lower electrode of the capacitor formed on the inter-level insulating film having the flattened surface;

an insulating film formed on the lower electrode and having a hole portion which reaches the lower electrode;

a ferroelectric film formed inside the hole portion; and an upper electrode of the capacitor formed on the ferroelectric film.

The second semiconductor device according to the present invention is a semiconductor device having a capacitor formed on a semiconductor substrate, which comprises:

an inter-level insulating film formed on the semiconductor substrate, and having a contact hole;

a lower electrode of the capacitor formed inside the contact hole and on the inter-level insulating film around the contact hole;

a first insulating film formed on the inter-level insulating film in such a manner that a surface of the inter-level insulating film lies in the same plane as a surface of the lower electrode;

a second insulating film formed on the first insulating film and on the lower electrode, and having a hole portion which reaches the surface of the lower electrode;

a ferroelectric film formed on the lower electrode in such a manner that a surface of the ferroelectric film lies in the same plane as a surface of the second insulating film; and an upper electrode of the capacitor formed on the ferroelectric film.

In one aspect of the present invention, the ferroelectric film contains at least one kind of materials selected from the group consisting of $SrTiO_3$, $BaTiO_3$ and $(Ba, Sr)TiO_3$.

According to the production method of a semiconductor device of the present invention, the ferroelectric film is polished and removed by a chemical-mechanical polishing method to leave the ferroelectric film only inside the insulating film, and patterning of the ferroelectric film thus becomes possible. In other words, patterning of the ferroelectric film made of the material such as $SrTiO_3$, $BaTiO_3$ or $(Ba, Sr)TiO_3$, for which dry etching has been difficult in the past, becomes possible, and the necessity for using wet etching, which cannot be easily practiced for fine etching, can be eliminated.

DESCRIPTION OF THE PREFERRED EMBODIMENTS

Figure 1A:
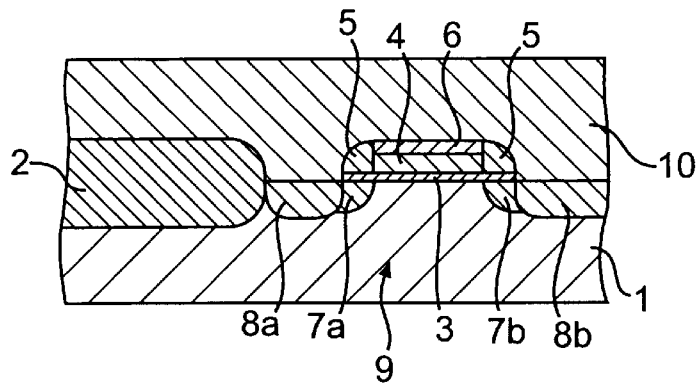
FIGS. 1A to 1C are sectional views, each showing stepwise a production process of a semiconductor device according to the first embodiment of the present invention.

In the production method of a semiconductor device according to the first embodiment of the present invention, a field oxide film 2 for defining an active region is first formed on a silicon substrate 1, as shown in FIG. 1A, and then a gate electrode 4 comprising a polycrystalline silicon film, whose periphery is covered with a gate oxide film 3, a sidewall oxide film 5 and a cap oxide film 6, is formed. Low concentration impurity diffusion layers 7a and 7b having a shallow junction and high concentration impurity diffusion layers 8a and 8b having a deep junction are formed in the silicon substrate 1 on both sides of the gate electrode 4. An MOS transistor 9 is formed by the steps described above. Thereafter, an inter-level insulating film 10 such as a BPSG film is formed over the entire surface of the silicon substrate 1.

Figure 1B:
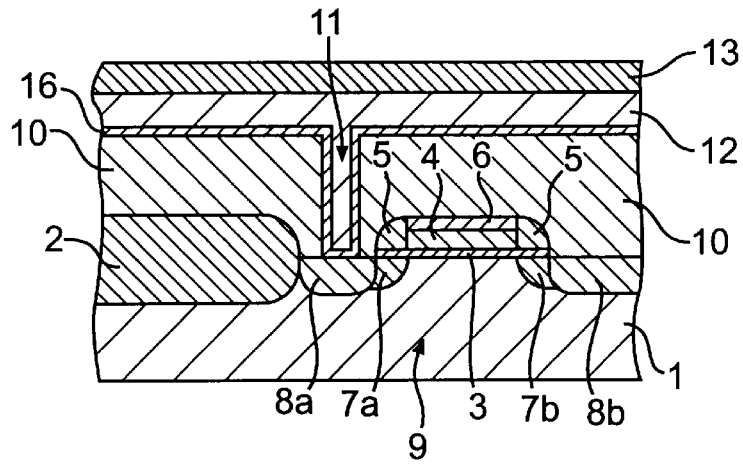

Next, a contact hole 11, reaching the high concentration impurity diffusion layer 8a on the left-hand portion of the drawing, is formed in the inter-level insulating film 10, as shown in FIG. 1B. A Pt film 12 having a film thickness of about 100 nm and coming into contact with the high concentration impurity diffusion layer 8a via a Ti film 16, which has a film thickness of about 50 nm, at the bottom of the contact hole 11 is formed on the inter-level insulating film 10. A silicon dioxide film ($SiO_2$ film) having a film thickness of about 100 nm is formed via the Ti film 16 on the Pt film 12.

Figure 1C:
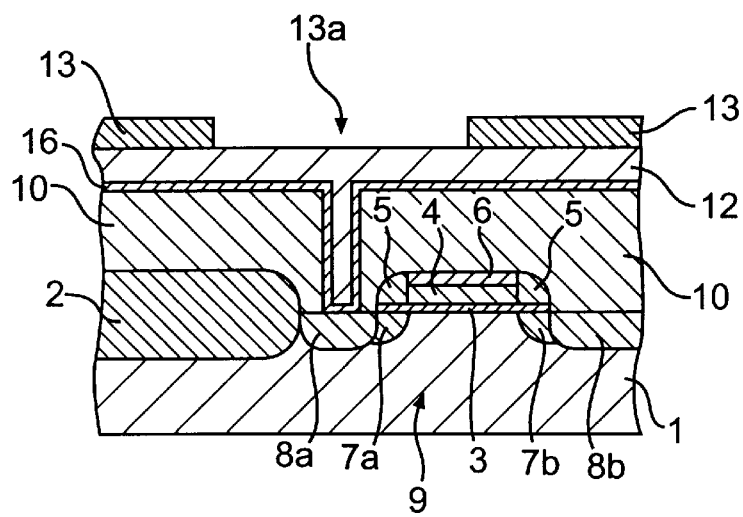

After a photoresist film (not shown in the drawing) is applied to the silicon dioxide film 13, this photoresist film is selectively patterned. The silicon dioxide film 13 is then etched selectively by using the photoresist film so patterned as a mask until the Pt film 12 is exposed, forming a hole portion 13a, as shown in FIG. 1C. Thereafter, the photoresist film is removed.

Figure 2A:
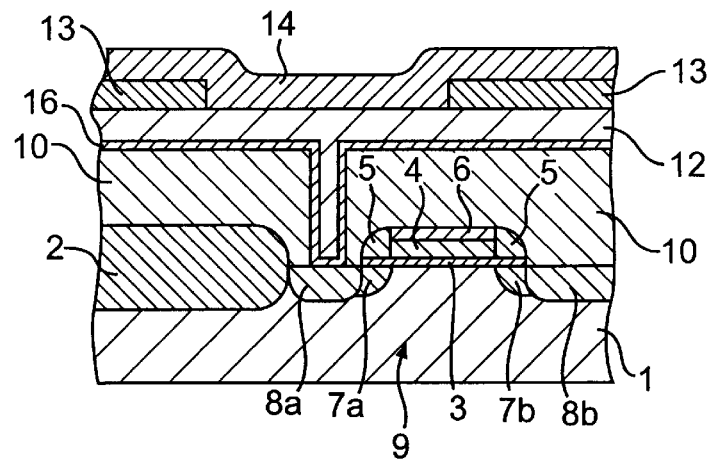
FIGS. 2A to 2C are sectional views, each showing stepwise a production process of a semiconductor device according to the first embodiment of the present invention.

Subsequently, a (Ba, Sr)$TiO_3$ film 14 having a film thickness of about 200 nm is formed on the silicon dioxide film 13 by sputtering to bury the hole portion 13a, as shown in FIG. 2A.

Figure 2B:
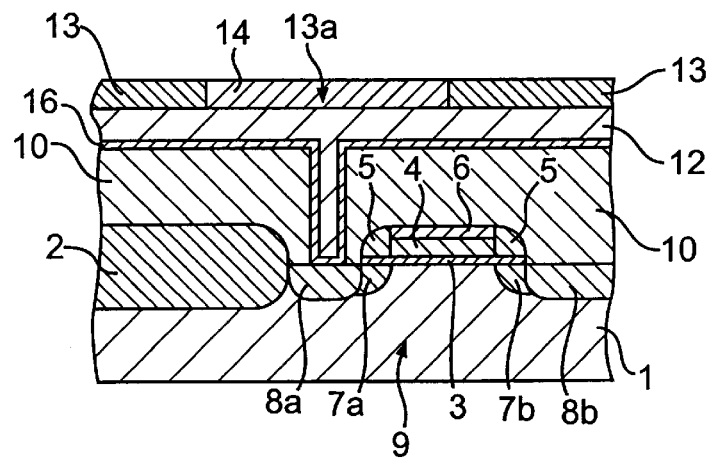
Figure 2C:
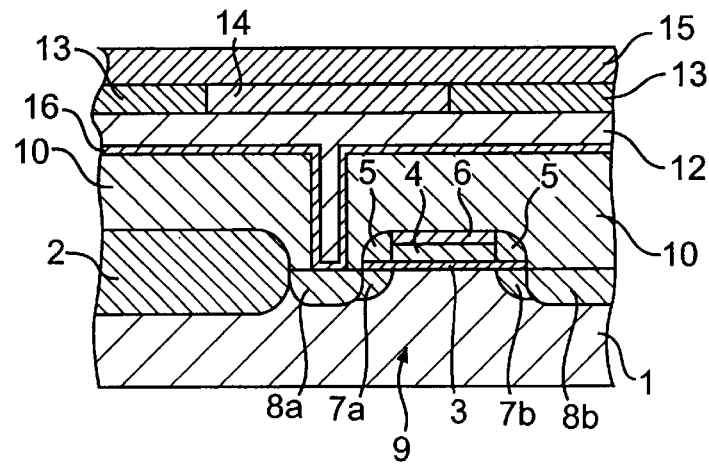

Next, the (Ba, Sr)$TiO_3$ film 14 is polished and removed by a chemical-mechanical polishing method using a polishing agent (amine solution) containing $Al_2O_3$ as abrasives until the surface of the silicon dioxide film 13 is exposed, as shown in FIG. 2B. As a result, the (Ba, Sr)$TiO_3$ film 14 remains only inside the hole portion 13a of the silicon dioxide film 13.

Next, an aluminum film 15 having a film thickness of about 500 nm is formed on the (Ba, Sr)$TiO_3$ film 14 remaining inside the hole portion 13a and on the silicon dioxide film 13. After a photoresist film, not shown, is applied to this aluminum film 15, the photoresist film is selectively etched, and the aluminum film 15 in the region not covered with the photoresist film is removed. The photoresist film is thereafter removed.

A DRAM capacitor comprising the Pt film 12 as a lower electrode, the (Ba, Sr)$TiO_3$ film 14 as a ferroelectric film and the aluminum film 15 as an upper electrode is formed by the steps described above. Because the (Ba, Sr)$TiO_3$ film 14 as the ferroelectric film is patterned not by etching but by the chemical-mechanical polishing method, fine machining can be carried out.

Ferroelectric films such as $SrTiO_3$, $BaTiO_3$, and the like, may be used in place of the (Ba, Sr)$TiO_3$ film 14, and a silicon nitride film (SiN film) may be used in place of the silicon dioxide film 13.

Next, the production method of a semiconductor device according to the second embodiment of the present invention will be explained. In the production method of a semiconductor device according to the first embodiment described above, the Ti film 16 and the Pt film 12 are formed without polishing the inter-level insulating film 10 at the steps shown in FIG. 1B. However, because the gate electrode 4 or the like is formed on the silicon substrate 1, the surface of the inter-level insulating film 10 is not flat, but underlying-steps (step portions and concavities) occur. As a result, when the (Ba, Sr)$TiO_3$ film 14 is polished by the chemical-mechanical polishing method at the steps shown in FIG. 2B, the (Ba, Sr)$TiO_3$ film 14 is likely to remain on the underlying-steps other than inside the hole portion 13a of the silicon dioxide film 13 on which the (Ba, Sr)$TiO_3$ film should be originally left.

In this embodiment, therefore, after the inter-level insulating film 10 is formed on the silicon substrate 1, its surface is polished and flattened by the chemical-mechanical polishing method. The polishing agent used at this time may contain $SiO_2$ as abrasives in an amine solution. Thereafter, the same steps as those shown in FIGS. 1B, 1C and 2A–2C are performed.

Even when any underlying-steps exist when the ferroelectric film is polished by the chemical-mechanical polishing method, the (Ba, Sr)$TiO_3$ film 14 can be buried into only the hole portion 13a of the silicon dioxide film 13.

Next, the production method of a semiconductor device according to the third embodiment of the present invention will be explained. This embodiment, too, solves the problem of the underlying-steps in the same way as in the second embodiment described above.

Figure 3A:
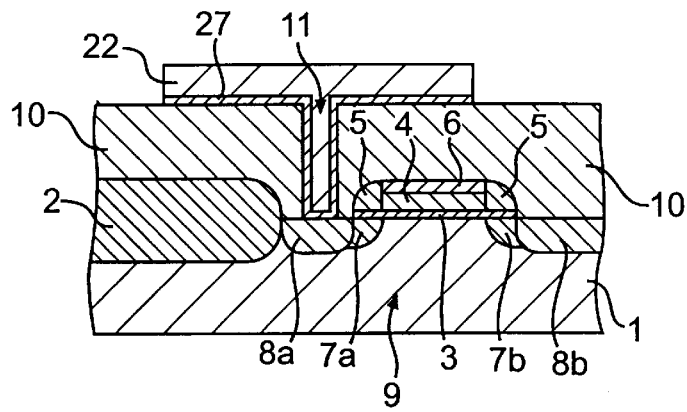
FIGS. 3A to 3D are sectional views, each showing stepwise a production process of a semiconductor device according to the third embodiment of the present invention.

According to this embodiment, the field oxide film 2 defining the active region is first formed on the silicon substrate 2 as shown in FIG. 3A, and the gate electrode 4 comprising the polycrystalline silicon film whose periphery is covered with the gate oxide film 3, the sidewall oxide film 5 and the cap oxide film 6 is then formed. The low concentration impurity diffusion layers 7a and 7b having a shallow junction and the high concentration impurity diffusion layers 8a and 8b having a deep junction are formed in the silicon substrate 1 on both sides of the gate electrode 4. An MOS transistor 9 is formed by these steps. Thereafter, the inter-level insulating film 10 comprising the BPSG film, or the like, is formed on the entire surface of the silicon substrate 1.

Subsequently, the contact hole 11 reaching the high concentration impurity diffusion layer 8a on the left-hand portion of the drawing is formed in the inter-level insulating film 10. The Pt film 22 having a film thickness of about 100 nm, which comes into contact with the high concentration impurity diffusion layer 8a via a Ti film 27, which has a film thickness of about 50 nm, at the bottom of the contact hole 11, is formed on the entire surface of the Ti film 27. The photoresist film (not shown) is applied to the Pt film 22 and is then patterned selectively. The Pt film 22 and the Ti film 27 are selectively etched by using the patterned photoresist film as a mask. As a result, the Pt film 22 and the Ti film 27 are left only inside the contact hole 11 and its peripheral portion as shown in FIG. 3A. The photoresist film is thereafter removed.

Figure 3B:
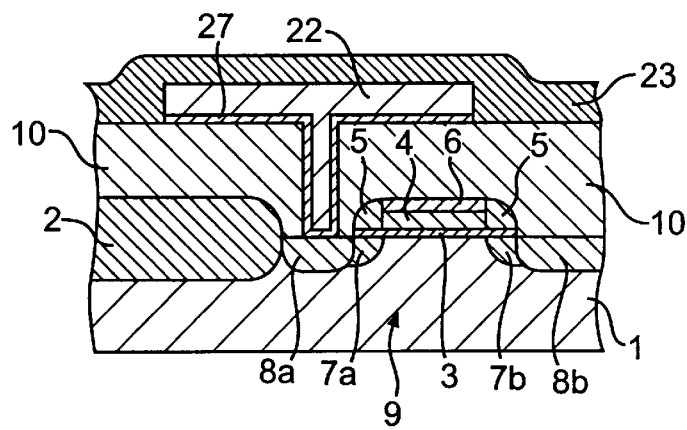
Figure 3C:
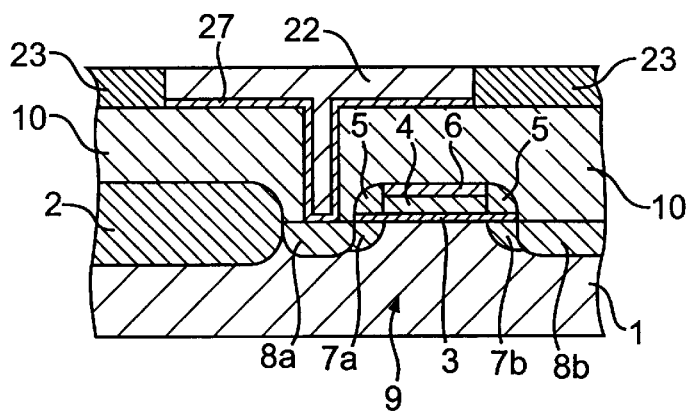

Next, the silicon dioxde film ($SiO_2$ film) 23 having a film thickness of about 200 nm is formed on the inter-level insulating film 10 and on the Pt film 12 as shown in FIG. 3B.

The surface of the silicon dioxide film 23 is then polished and removed by the chemical-mechanical polishing method using the polishing agent (amine solution) containing $SiO_2$ as the abrasives until the surface of the Pt film 22 is exposed.

Figure 3D:
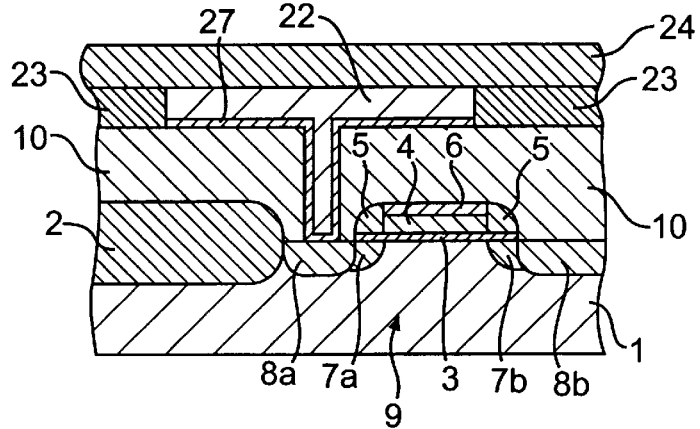

The silicon dioxide film ($SiO_2$ film) 24 having a film thickness of about 100 nm is formed on the Pt film 22 and on the silicon dioxide film 23 as shown in FIG. 3D.

Figure 4A:
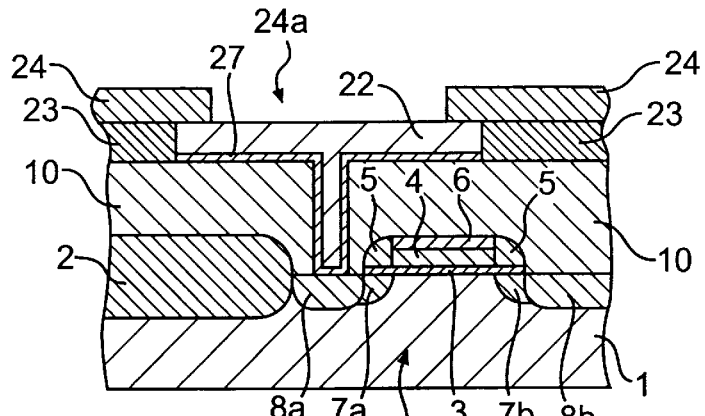
FIGS. 4A to 4D are sectional views, each showing stepwise a production process of a semiconductor device according to the third embodiment of the present invention.
Figure 4B:
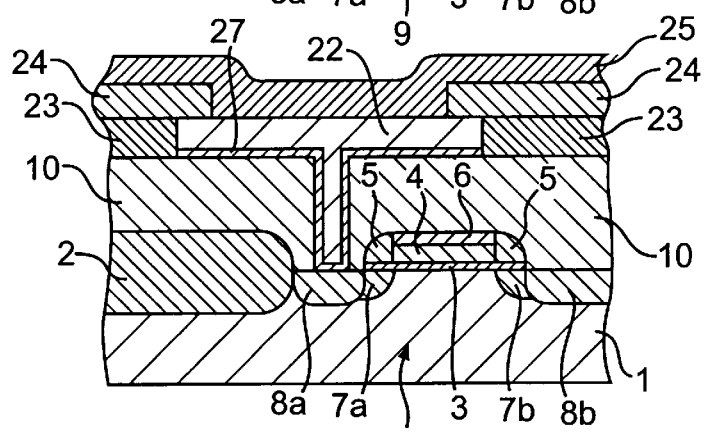

After the photoresist film (not shown) is applied to the silicon dioxide film 24, this photoresist film is patterned selectively. The silicon dioxide film 24 is then etched selectively by using the patterned photoresist film until the surface of the Pt film 22 is exposed. In this way, the hole portion 24a is formed in the silicon dioxide film 24, as shown in FIG. 4A. The photoresist film is thereafter removed.

Subsequently, the (Ba, Sr)$TiO_3$ film 25, having a film thickness of about 200 nm, is formed by sputtering on the silicon dioxide film 24 in such a manner as to bury the hole portion 24a.

Figure 4C:
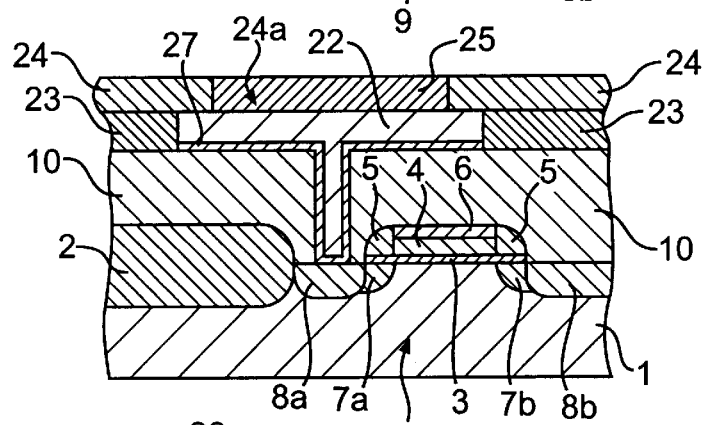

The (Ba, Sr)$TiO_3$ film 25 is polished and removed by the chemical-mechanical polishing method using the polishing agent (amine solution) containing $Al_2O_3$ as abrasives until the surface of the silicon dioxide film 24 is exposed, as shown in FIG. 4C. As a result, the (Ba, Sr)$TiO_3$ film 25 remains inside only the hole portion 24a of the silicon dioxide film 24.

Figure 4D:
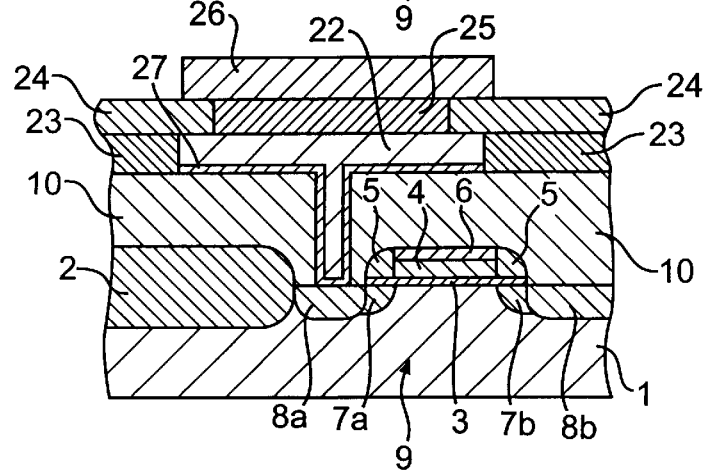

Next, as shown in FIG. 4D, the aluminum film 26 having a film thickness of about 500 nm is formed in the (Ba, Sr)$TiO_3$ film 25 remaining inside the hole portion 24a and on the silicon dioxide film 24. After the photoresist film, not shown, is applied to the aluminum film 26, it is selectively patterned. Next, the aluminum film 26 is selectively etched by using the photoresist film so patterned as the mask, and the aluminum film 26 in the region which is not covered with the photoresist film is removed. The photoresist film is thereafter removed.

A DRAM capacitor comprising the Pt film 22 as the lower electrode, the (Ba, Sr)$TiO_3$ film 25 as the ferroelectric film and the aluminum film 26 as the upper electrode is formed by these steps. Because the (Ba, Sr)$TiO_3$ film 25 is patterned by the chemical-mechanical polishing method but not by etching at this time, fine machining can be carried out. Since the Pt film 22 is buried into the silicon dioxide film 23, the underlying-steps can be eliminated, and the (Ba, Sr)$TiO_3$ film 25 does not remain in regions other than in the region in which the (Ba, Sr)$TiO_3$ film 25 should be originally left at the time of polishing.

A ferroelectric film such as $SrTiO_3$ or $BaTiO_3$ may be used in place of the (Ba, Sr)$TiO_3$ film 25, and a silicon nitride film (SiN film) may be used in place of the silicon dioxide films 23 and 24.

The present invention can be applied to DRAMS having a capacitance element (capacitor) using such a ferroelectric film as the dielectric film and to LSIs having such capacitance elements in the peripheral circuit portions thereof. Therefore, the chip area of such DRAMs and LSIs can be reduced as fine machining of these capacitance elements can be conducted.

As described above, the present invention can machine the ferroelectric film, which has previously been difficult to etch by dry etching, into a fine pattern shape. Therefore, the present invention can save the occupying proportion of the capacitor in the chip area and can provide a high density semiconductor device.

What is claimed is:

1. A production method of a semiconductor device having a capacitor formed on a semiconductor substrate, comprising:

forming a lower electrode of said capacitor portions of said lower electrode being formed in a via contact and on an inter-level insulating film;

forming an insulating film on said lower electrode;

forming a hole portion in said insulating film by selectively etching said insulating film until said lower electrode is exposed;

forming a ferroelectric film inside said hole portion and on said insulating film;

polishing and removing said ferroelectric film by a chemical-mechanical polishing method in such a manner as to leave said ferroelectric film inside said hole portion; and forming an upper electrode of said capacitor on said ferroelectric film.

2. A production method of a semiconductor device according to claim 1, wherein said ferroelectric film contains at least one kind of material selected from the group consisting of $SrTiO_3$, $BaTiO_3$ and (Ba, Sr)$TiO_3$.

3. A production method of a semiconductor device having a capacitor formed on a semiconductor substrate, comprising:

forming a filed oxide film on said semiconductor substrate to define an active region;

forming an inter-level insulating film on said semiconductor substrate and on said field oxide film;

polishing a surface of said inter-level insulating film by a chemical-mechanical polishing method and flattening the surface of said inter-level insulating film;

forming a lower electrode of said capacitor on said inter-level insulating film whose surface is flattened, overlying at least a portion of a gate electrode and of the field oxide film;

forming an insulating film on said lower electrode;

selectively etching said insulating film until said lower electrode is exposed, and forming thereby a hole portion in said insulating film;

forming a ferroelectric film inside said hole portion and on said insulating film;

polishing and removing said ferroelectric film by a chemical-mechanical polishing method such as to leave said ferroelectric film inside said hole portion; and forming an upper electrode of said capacitor on said ferroelectric film.

4. A production method of a semiconductor device according to claim 3, wherein said ferroelectric film includes at least one kind of material selected from the group consisting of $SrTiO_3$, $BaTiO_3$ and (Ba, Sr)$TiO_3$.

5. A production method of a semiconductor device having a capacitor formed on a semiconductor substrate, comprising:

a first step of forming an inter-level insulating film on said semiconductor substrate;

a second step of forming a contact hole in said inter-level insulating film;

a third step of forming a lower electrode of said capacitor inside said contact hole and on said inter-level insulating film around said contact hole;

a fourth step of forming a first insulating film on said lower electrode and on said inter-level insulating film;

a fifth step of polishing and removing said first insulating film by a chemical-mechanical polishing method until said lower electrode is exposed;

a sixth step of forming a second insulating film on said first insulating film and on said exposed lower electrode;

a seventh step of forming a hole portion, which reaches a surface of said exposed lower electrode, by selectively etching said second insulating film until the surface of said exposed lower electrode is exposed;

an eighth step of forming a ferroelectric film inside said hole portion and on said second insulating film;

a ninth step of polishing and removing said ferroelectric film by a chemical-mechanical polishing method in such a manner as to leave said ferroelectric film inside said hole portion; and a tenth step of forming an upper electrode of said capacitor on said ferroelectric film.

6. A production method of a semiconductor device according to claim 5, wherein said ferroelectric film includes at least one kind of material selected from the group consisting of $SrTiO_3$, $BaTiO_3$ and (Ba, Sr)$TiO_3$.

7. A method of forming a semiconductor device, comprising:

(a) forming an inter-level insulating film on a semiconductor substrate;

(b) forming a contact hole through the inter-level insulating film to the substrate;

(c) forming a lower electrode from at least one film which is formed in the contact hole and above the inter-level insulating film;

(d) forming a first insulating film on at least the lower electrode;

(e) etching the first insulating film to form a hole portion exposing the lower electrode;

(f) forming a ferroelectric film inside the hole portion and on the first insulating film;

(g) performing chemical-mechanical polishing to polish and remove the ferroelectric film such that the ferroelectric film remains inside the hole portion;

(h) forming an upper electrode on the ferroelectric film.

8. The method of claim 7 wherein the lower electrode is formed above the inter-level insulating film only in areas around the contact hole.

9. The method of claim 8 further comprising, after step (c) and before step (d):

forming a second insulating film on the lower electrode and the inter-level insulating film; and performing chemical-mechanical polishing to polish and remove the second insulating film to expose the lower electrode.

10. The method of claim 9 wherein the first insulating film is also formed on the second insulating film.

11. The method of claim 9 further comprising selectively etching the upper electrode.

12. The method of claim 7 wherein the lower electrode is formed within a second insulating layer that is subject to chemical-mechanical polishing.

13. The method of claim 9 wherein the second insulating film comprises a silicon dioxide film.

14. The method of claim 13 wherein the ferroelectric film contacts the silicon dioxide film.

15. A production method of a semiconductor device according to claim 7, wherein said ferroelectric film includes at least one kind of materials selected from the group consisting of $SrTiO_3$, $BaTiO_3$ and $(Ba, Sr)TiO_3$.

* * * * *